United States Patent
Minami et al.

(10) Patent No.: US 10,468,521 B2
(45) Date of Patent: Nov. 5, 2019

(54) LOAD MODULATION CIRCUIT AND SEMICONDUCTOR DEVICE, AND WIRELESS POWER SUPPLY SYSTEM

(71) Applicant: Kabushiki Kaisha Toshiba, Minato-ku, Tokyo (JP)

(72) Inventors: Kazuyasu Minami, Yokohama Kanagawa (JP); Hirotoshi Aizawa, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 14/995,693

(22) Filed: Jan. 14, 2016

(65) Prior Publication Data
US 2017/0063154 A1   Mar. 2, 2017

(30) Foreign Application Priority Data
Aug. 26, 2015   (JP) .................. 2015-166573

(51) Int. Cl.
| H01F 27/42 | (2006.01) |
| H01L 29/78 | (2006.01) |
| H04B 5/00 | (2006.01) |
| H02J 50/12 | (2016.01) |
| H02J 50/80 | (2016.01) |
| H01L 21/8234 | (2006.01) |
| H01L 27/088 | (2006.01) |

(52) U.S. Cl.
CPC .......... *H01L 29/7816* (2013.01); *H02J 50/12* (2016.02); *H02J 50/80* (2016.02); *H04B 5/0037* (2013.01); *H01L 21/823493* (2013.01); *H01L 27/088* (2013.01)

(58) Field of Classification Search
CPC .... H02J 7/025; H02J 5/05; H04B 5/31; H04B 5/37
See application file for complete search history.

(56) References Cited

U.S. PATENT DOCUMENTS

| 7,703,677 B2 | 4/2010 | Alihodzic |
| 9,564,760 B2 | 2/2017 | Kamata |
| 9,847,652 B2 | 12/2017 | Nakano et al. |
| 2005/0116697 A1 | 6/2005 | Matsuo et al. |

(Continued)

FOREIGN PATENT DOCUMENTS

| JP | H05-59660 B2 | 8/1993 |
| JP | H08-340285 A | 12/1996 |

(Continued)

OTHER PUBLICATIONS

Taiwanese Office Action dated Jun. 1, 2017 in counterpart Taiwanese patent Application No. 105107409, along with English translation thereof.

(Continued)

*Primary Examiner* — Sibin Chen
(74) *Attorney, Agent, or Firm* — White & Case LLP

(57) ABSTRACT

A load modulation circuit of an embodiment has a first element, a switch element configured to connect the first element to an end portion of a coil, a first control section configured to control an operation of the switch element, and a second control section configured to control an amount of electric charges accumulated in the first element, and the second control section discharges the electric charges accumulated in the first element when the switch element is switched to off.

18 Claims, 4 Drawing Sheets

(56) References Cited

U.S. PATENT DOCUMENTS

| | | |
|---|---|---|
| 2006/0293000 A1 | 12/2006 | Sorrells et al. |
| 2012/0161531 A1 | 6/2012 | Kim |
| 2013/0147279 A1* | 6/2013 | Muratov ............... H02J 5/005 307/104 |
| 2013/0147281 A1* | 6/2013 | Kamata ................ H02J 17/00 307/104 |
| 2014/0139199 A1 | 5/2014 | Khlat et al. |
| 2015/0162754 A1* | 6/2015 | Nakano ............... H02J 5/005 307/104 |
| 2015/0205750 A1* | 7/2015 | Hendin ............. G06F 13/4221 713/155 |
| 2015/0364928 A1* | 12/2015 | Yen ..................... H01F 38/14 320/108 |
| 2016/0268834 A1 | 9/2016 | Satyamoorthy et al. |
| 2016/0299521 A1 | 10/2016 | Akram et al. |

FOREIGN PATENT DOCUMENTS

| | | |
|---|---|---|
| JP | 3493537 B2 | 2/2004 |
| JP | 2005-267643 A | 9/2005 |
| JP | 2011-040890 A | 2/2011 |
| JP | 2013-141387 A | 7/2013 |
| JP | 2014-171278 A | 9/2014 |
| JP | 2015111968 A | 6/2015 |
| WO | 2015/105924 A1 | 7/2015 |

OTHER PUBLICATIONS

Chinese Office Action along with English Translation dated Jun. 5, 2018 in counterpart CN Application No. 201610140829.0.

Japanese Office Action dated Oct. 9, 2018 issued in corresponding Japanese Patent Application No. 2015-166573, with English translation.

Japanese Office Action along with English Translation dated Jul. 24, 2018 in corresponding Japanese Patent Application No. 2015-166573.

Taiwanese Office Action dated Dec. 26, 2017 in counterpart Taiwanese Patent Application No. 105107409, along with English translation thereof.

* cited by examiner

LOAD MODULATION CIRCUIT AND SEMICONDUCTOR DEVICE, AND WIRELESS POWER SUPPLY SYSTEM

CROSS-REFERENCE TO RELATED APPLICATION

This application is based upon and claims the benefit of priority from the prior Japanese Patent Application No. 2015-166573 filed on Aug. 26, 2015; the entire contents of which are incorporated herein by reference.

FIELD

An embodiment described herein relates generally to a load modulation circuit and a semiconductor device, and a wireless power supply system.

BACKGROUND

In recent years, a so-called wireless power supply technique of performing power transfer without contact by electromagnetic coupling between coils has been widely used. As methods for wirelessly transferring electric power, various methods have been conventionally proposed. In recent years, a wireless power supply technique by a so-called "electromagnetic inductive method" has attracted attention. The electromagnetic inductive method uses the principle of electromagnetic induction that when an electric current is passed to one of two adjacent coils, an electromotive force is generated in the other adjacent coil with a magnetic flux which is generated as a medium, and products loaded with wireless power supply systems by the electromagnetic induction method have also started to be put into practice.

In the wireless power supply system by the electromagnetic induction method, a one-way communication from a power receiving side to a power transmission side is performed. A load modulation circuit is connected to an antenna coil on the power receiving side, and the load of the load modulation circuit is varied, whereby the load capacity on the power receiving side is changed. Thereby, the amplitude of the coil voltage on the transmission side is changed, and binary ASK (amplitude shift keying) is realized. Generally in a load modulation circuit using a capacitor, a transistor is used as a switching element, and accumulation and discharge of electric charges to and from the capacitor are controlled, whereby the total load capacity on the power receiving side is changed.

In the wireless power supply system by the electromagnetic induction method, a one-way communication from a power receiving side to a power transmission side is performed. A load modulation circuit is connected to an antenna coil on the power receiving side, and the load of the load modulation circuit is varied, whereby the load capacity on the power receiving side is changed. Thereby, the amplitude of the coil voltage on the transmission side is changed, and binary ASK (amplitude shift keying) is realized. Generally in a load modulation circuit using a capacitor, a transistor is used as a switching element, and accumulation and discharge of electric charges to and from the capacitor are controlled, whereby the total load capacity on the power receiving side is changed.

The transistor used as the switching element is generally incorporated into the same chip as a peripheral circuit by using a C-DMOS (complementary and doublediffused MOS) process, and therefore is configured by an LDMOS (laterally diffused MOS) with high withstand voltage. In such a configuration, when the capacitor which is used for load modulation is in a state where electric charges are accumulated in the capacitor, the transistor is in an off state, and a drain voltage drops by a forward voltage or more from a reference voltage (GND), a parasitic diode formed between the substrate and the well diffusion region of the same transistor becomes a discharge path of the capacitor.

However, when the transistor is formed by using a C-DMOS (complementary and doublediffused MOS) process, the same transistor and the peripheral circuit are not completely separated electrically, and therefore, a parasitic bipolar transistor with a near diffusion region in contact with the substrate (the diffusion region of the same conductive type as that of the well diffusion region) as a collector is operated by the discharge current by the parasitic diode. Accordingly, the problem arises, that the possibility of the peripheral circuit using the near diffusion region to be the supply source of a collector current operating erroneously becomes high. Further, when a high potential is applied to the diffusion region, the problem arises, that power consumption by the collector current of the parasitic bipolar transistor becomes so large that the heating value increases.

DETAILED DESCRIPTION

A load modulation circuit of an embodiment has a first element, a switch element configured to connect the first element to an end portion of a coil, a first control section configured to control an operation of the switch element, and a second control section configured to control an amount of electric charges accumulated in the first element, wherein the second control section discharges the electric charges accumulated in the first element when the switch element is switched to off.

Hereinafter, the embodiment will be described with reference to the drawings.

Figure 1:
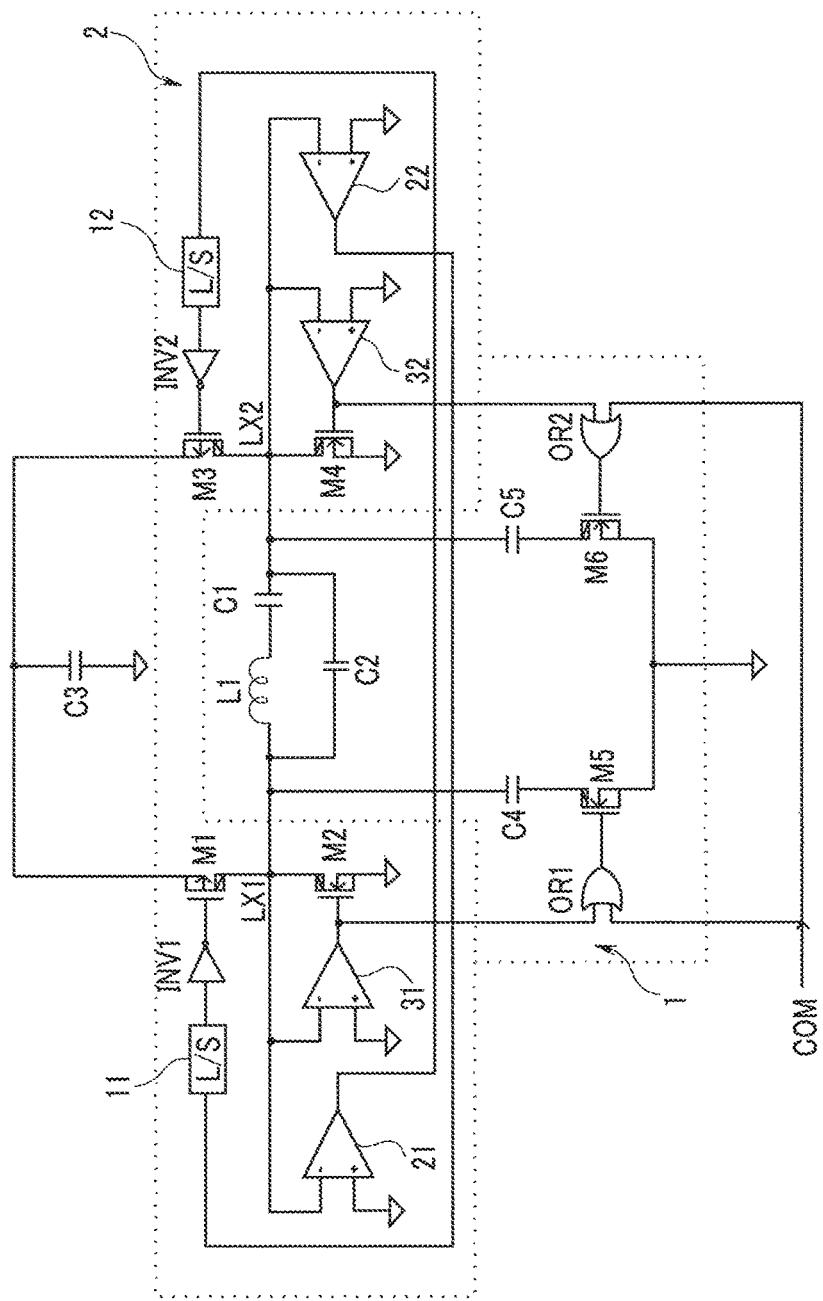
FIG. 1 is a schematic block diagram explaining a configuration of a wireless power supply antenna device using a load modulation circuit according to the present embodiment.

FIG. 1 is a schematic block diagram explaining a configuration of a wireless power supply antenna device using the load modulation circuit according to the embodiment of the present invention. The wireless power supply antenna device is configured mainly by a power receiving antenna coil L1, a series resonant capacitance C1, a parallel load capacitance C2, a synchronous rectification circuit 2, a load modulation circuit 1 and a full-wave rectification smoothing capacitance C3. The synchronous rectification circuit 2 is a circuit configured to invert a voltage at a negative side of an AC voltage that is received at the power receiving antenna coil L1, and outputs an absolute value of an inputted voltage. The load modulation circuit 1 is a circuit configured to change impedance of the power receiving antenna coil L1, and change an amplitude of the AC voltage that is received at the power receiving antenna coil L1. The full-wave rectification smoothing capacitance C3 is a capacitance for reducing a pulsation component of a pulsating voltage which undergoes full-wave rectification by the synchronous rectification circuit 2, and extracting a DC voltage.

One end of the power receiving antenna coil L1 is connected to one input terminal LX1 of the synchronous rectification circuit 2. Further, the other end of the power receiving antenna coil L1 is connected to the other input terminal LX2 of the synchronous rectification circuit 2 via the series resonant capacitance C1. Further, the parallel load capacitance C2 is connected in parallel with the power receiving antenna coil L1 and the series resonant capacitance C1 which are connected in series. That is, one end of the parallel load capacitance C2 is connected to the one input terminal LX1 of the synchronous rectification circuit 2, and the other end is connected to the other input terminal LX2 of the rectification circuit 2.

The synchronous rectification circuit 2 is a full-bridge synchronous rectifying circuit configured by four synchronous rectifying transistors M1, M2, M3 and M4, four comparators 21, 22, 31 and 32, two inverters INV1 and INV2, and two level shift circuits 11 and 12. The synchronous rectifying transistors M1 and M3 that are high-side switches are configured by P-type MOS transistors, and the synchronous rectifying transistors M2 and M4 that are low-side switches are configured by N-type MOS transistors.

The synchronous rectifying transistors M1 and M2 have respective drains connected to the input terminal LX1. The synchronous rectifying transistors M3 and M4 have respective drains connected to the input terminal LX2. Further, the synchronous rectifying transistors M1 and M3 have respective sources connected to one end of the full-wave rectification smoothing capacitance C3. The synchronous rectifying transistors M2 and M4 have respective sources connected to GND (ground).

In the comparator 21, the one input terminal LX1 of the synchronous rectification circuit 2 is connected to an inverted input, and GND is connected to a non-inverted input. Further, an output of the comparator 21 is inputted to a gate of the synchronous rectifying transistor M3 via the level shift circuit 12 and the inverter INV2. That is, the synchronous rectifying transistor M3 is controlled by the comparator 21 so as to be turned on, when a potential of the input terminal LX1 is reduced to be lower than GND.

In the comparator 22, the other input terminal LX2 of the synchronous rectification circuit 2 is connected to an inverted input, and GND is connected to a non-inverted input. Further, an output of the comparator 22 is inputted to a gate of the synchronous rectifying transistor M1 via the level shift circuit 11 and the inverter INV1. That is, the synchronous rectifying transistor M1 is controlled by the comparator 22 so as to be turned on when a potential of the input terminal LX2 is reduced to be lower than GND.

In the comparator 31, the one input terminal LX1 of the synchronous rectification circuit 2 is connected to an inverted input, and GND is connected to a non-inverted input. Further, an output of the comparator 31 is inputted to a gate of the synchronous rectifying transistor M2. That is, the synchronous rectifying transistor M2 is controlled by the comparator 31 to be turned on when the potential of the input terminal LX1 is reduced to be lower than GND.

In the comparator 32, the other input terminal LX2 of the synchronous rectification circuit 2 is connected to an inverted input, and GND is connected to a non-inverted input. Further, an output of the comparator 32 is inputted to a gate of the synchronous rectifying transistor M4. That is, the synchronous rectifying transistor M4 is controlled by the comparator 32 to be turned on when the potential of the input terminal LX2 is reduced to be lower than GND.

In this way, the comparators 21, 22, 31 and 32 compare the potentials of the input terminals LX1 and LX2, and control on/off timings of the synchronous rectifying transistors M1, M2, M3 and M4 so that impedance of a path along a direction of a flow of an AC current received at the power receiving antenna coil L1 becomes the smallest among paths that pass through the power receiving antenna coil L1 from GND to reach the full-wave rectification smoothing capacitance C3.

That is, when the potential of the input terminal LX1 is higher than the potential of the input terminal LX2, the synchronous rectifying transistors M1 and M4 are controlled to be on, and the synchronous rectifying transistors M2 and M3 are controlled to be off, whereby electric charges are accumulated in the full-wave rectification smoothing capacitance C3 via the synchronous rectifying transistor M4, the series resonant capacitance C1, the power receiving antenna coil L1 and the synchronous rectifying transistor M1 from the GND which is connected to the source of the synchronous rectifying transistor M4. Further, when the potential of the input terminal LX2 is higher than the potential of the input terminal LX1, the synchronous rectifying transistors M2 and M3 are controlled to be on, and the synchronous rectifying transistors M1 and M4 are controlled to be off, whereby electric charges are accumulated in the full-wave rectification smoothing capacitance C3 via the synchronous rectifying transistor M2, the power receiving antenna coil L1, the series resonant capacitance C1 and the synchronous rectifying transistor M3 from the GND which is connected to the source of the synchronous rectifying transistor M2.

Note that the comparators 21, 22, 31 and 32 respectively have offset voltages set for inputs, and on/off timings of the synchronous rectifying transistors M1, M2, M3 and M4 are regulated.

The sources of the synchronous rectifying transistors M1 and M3 are connected to one end of the full-wave rectification smoothing capacitance C3, and GND is connected to the other end. An AC current which is induced to the power receiving antenna coil L1 is subjected to full-wave rectification by the synchronous rectification circuit 2, and electric charges are accumulated in the full-wave rectification smoothing capacitance C3.

The load modulation circuit 1 is configured by two load regulating capacitances C4 and C5 as capacitors that change impedance of the power receiving antenna coil L1, and a load modulation control circuit. The load modulation control circuit is configured by two load modulation controlling transistors M5 and M6, and two OR circuits OR1 and OR2. The load modulation controlling transistors M5 and M6 as switches that connect the load regulating capacitances C4 and C5 and the power receiving antenna coil L1 are configured by N-type MOS transistors.

One end of the load regulating capacitance C4 is connected to the one input terminal LX1 of the synchronous rectification circuit 2. Further, the other end of the load regulating capacitance C4 is connected to a drain of the load modulation controlling transistor M5.

One end of the load regulating capacitance C5 is connected to the other input terminal LX2 of the synchronous rectification circuit 2. Further, the other end of the load regulating capacitance C5 is connected to a drain of the load modulation controlling transistor M6.

Sources of the load modulation controlling transistors M5 and M6 are connected to GND. Note that between sources of the load modulation controlling transistors M5 and M6, and GND, pull-down resistors may be inserted.

An output from the comparator 31 and a load modulation control signal COM are inputted to the OR circuit OR1 as a first and a second control sections. The output from the OR circuit OR1 is inputted to a gate of the load modulation controlling transistor M5. Note that the load modulation control signal COM is a signal that switches on/off of control of a parallel load capacity value of the power receiving antenna coil L1 by the load modulation circuit. At a time of the load modulation control signal COM="H", load modulation is performed, and at a time of the load modulation control signal COM="L", load modulation is not performed.

Likewise, an output from the comparator 32 and the load modulation control signal COM are inputted to the OR circuit OR2 as the first and second control sections. An output of the OR circuit OR2 is inputted to a gate of the load modulation controlling transistor M6.

At the time of the load modulation control signal COM="H", the outputs of the OR circuits OR1 and OR2 are "H", and therefore, the load modulation controlling transistors M5 and M6 are turned on. Then, the load regulating capacitances C4 and C5 are connected in parallel to the parallel load capacitance C2, and therefore, the parallel load capacity value of the power receiving antenna coil L1 changes. That is, when the load modulation controlling transistors M5 and M6 are off, the parallel load capacity value of the power receiving antenna coil L1 is C2. When the load modulation controlling transistors M5 and M6 are on, the parallel load capacity value of the power receiving antenna coil L1 is C2+(C4+C5)/(C4×C5), and the capacity value changes by (C4+C5)/(C4×C5). In this way, an amplitude of an AC signal received at the power receiving antenna coil L1 is changed by the parallel load capacity value of the power receiving antenna coil L1 changing, and therefore, ASK communication to a side of a power transmission antenna coil that is electromagnetically coupled is enabled.

At the time of the load modulation control signal COM="L", the outputs of the OR circuits OR1 and OR2 are synchronized with the outputs of the comparators 31 and 32. That is, the load modulation controlling transistor M5 is turned on/off in synchronization with the synchronous rectifying transistor M2 which is connected to the input terminal LX1 side, and the load modulation controlling transistor M6 is turned on/off in synchronization with the synchronous rectifying transistor M4 which is connected to an input terminal LX2 side.

Figure 2:
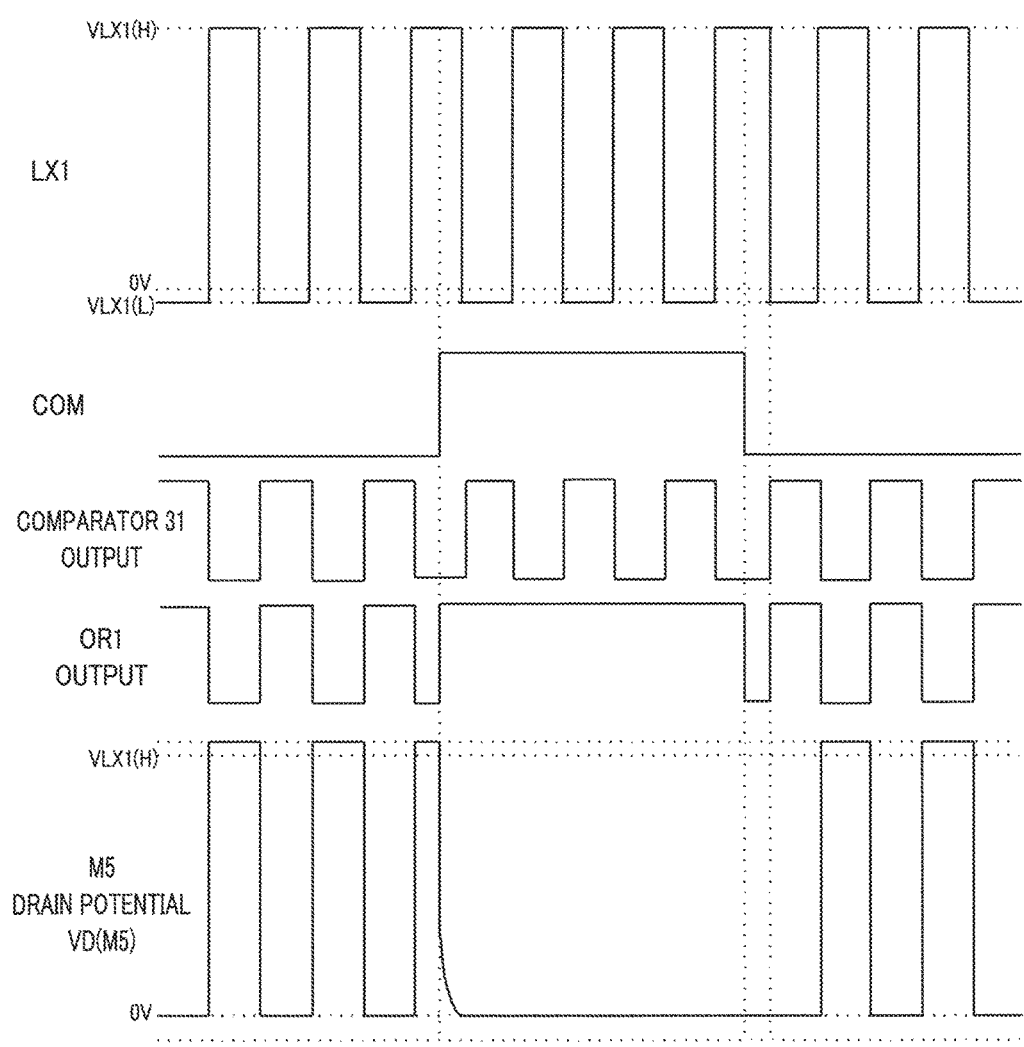
FIG. 2 is a diagram showing signal waveforms at respective points of the wireless power supply antenna device shown in FIG. 1.

Next, charge and discharge operations of the load regulating capacitances C4 and C5 at a time of load modulation will be described. Note that operations of the load regulating capacitance C5 and the load modulation controlling transistor M6 are the same as operations of the load regulating capacitance C4 and the load modulation controlling transistor M5, and therefore, the charge and discharge operations of the load regulating capacitance C4 will be described here. FIG. 2 is a diagram showing signal waveforms at respective points of the wireless power supply antenna device shown in FIG. 1. FIG. 2 shows respective waveforms of the potential of the input terminal LX1, the load modulation control signal COM, an output signal of the comparator 31, an output signal of the OR circuit OR1, and a drain potential of the load modulation controlling transistor M5.

1) In the Case of the Load Modulation Control Signal COM="L" (a State Before Load Modulation is Performed)

a) A Case where a Current Flows Out of the Input Terminal LX1

A potential VLX1 (L) of the input terminal LX1 is expressed by equation (1) shown as follows.

$$VLX1(L)=GND-Ichg \times Ron(M2) \quad \text{equation (1)}$$

In equation (1), Ichg represents a charge current, and Ron (M2) represents an on resistance of the synchronous rectifying transistor M2. Because of the load modulation control signal COM="L", the output value of the OR circuit OR1 which controls on/off of the load modulation controlling transistor M5, and timings at which the output value is switched from "H" to "L" and from "L" to "H" are equal to the output value of the comparator 31, and timings at which the output value is switched from "H" to "L", and from "L" to "H". That is, the load modulation controlling transistor M5 is turned on/off in synchronization with the synchronous rectifying transistor M2.

When a current flows out of the input terminal LX1, the output of the comparator 31 becomes "H", and the synchronous rectifying transistor M2 is in an on state. Since the output of the OR circuit OR1 also becomes "H", and the load modulation controlling transistor M5 is brought into an on state, a drain potential VD (M5) of the load modulation controlling transistor M5 converges to 0 V. Accordingly, a charge voltage VC4 of the load regulating capacitance C4 is expressed by equation (2) shown as follows.

$$VC4=GND-VLX1(L)=Ichg \times Ron(M2) \quad \text{equation (2)}$$

b) A Case where a Current Flows into the Input Terminal LX1

A potential VLX1 (H) of the input terminal LX1 is expressed by equation (3) shown as follows.

$$VLX1(H)=VC3+Ichg \times Ron(M1) \quad \text{equation (3)}$$

In equation (3), VC3 represents a voltage which is charged in the full-wave rectification smoothing capacitance C3, and Ron (M1) represents an on resistance of the synchronous rectifying transistor M1. When a current flows into the input terminal LX1, the output of the comparator 31 is "L", and the synchronous rectifying transistor M2 is brought into an off state. Since the output of the OR circuit OR1 is also "L", and the load modulation controlling transistor M5 is brought into an off state, the load regulating capacitance C4 does not discharge, and keeps a charge voltage VC4 expressed by equation (2). That is, once the load regulating capacitance C4 is charged to Ichg×Ron (M2) in a period of the load modulation control signal COM="L", the load regulating capacitance C4 continues to keep the charge voltage.

Note that at this time, the drain potential VD (M5) of the load modulation controlling transistor M5 is VLX1 (H)+VC4, and therefore, the drain potential VD (M5) keeps a potential higher than VLX1 (H) by Ichg×Ron (M2).

2) A Case of the Load Modulation Control Signal COM="L"→"H" (a State Switched to Load Modulation being Present)

When the load modulation control signal COM="H" is established, the output of the OR circuit OR1 which controls on/off of the load modulation controlling transistor M5 is always "H" irrespective of the output of the comparator 31, and the load modulation controlling transistor M5 is always brought into an on state. Therefore, the drain potential VD (M5) of the load modulation controlling transistor M5 converges to 0 V.

a) A Case where a Current Flows into the Input Terminal LX1

Since the potential of the input terminal LX1 is VLX1 (H) at this time, the load regulating capacitance C4 starts charge, and the charge voltage VC4 converges to a value expressed by equation (4) shown as follows.

$$VC4=VLX1(H)-VD(M5)\approx VLX1(H) \quad \text{equation (4)}$$

b) A Case where a Current Flows Out of the Input Terminal LX1

Since the potential of the input terminal LX1 is VLX1 (L) at this time, the load regulating capacitance C4 starts discharge, and the charge voltage VC4 converges to a value expressed by equation (5) shown as follows.

$$VC4=VD(M5)-VLX1(L)\approx -VLX1(L) \quad \text{equation (5)}$$

In this way, the load regulating capacitance C4 repeats charge and discharge in accordance with a direction of a current of the input terminal LX1. At this time, the load modulation controlling transistor M5 is always in an on state, and therefore, a charge and discharge current IC4 of the load regulating capacitance C4 is restricted by on resistance of the load modulation controlling transistor M5.

3) A Case of the Load Modulation Control Signal COM="H"→"L" (a State Switched to No Load Modulation)

When the load modulation signal COM="L" is established, the output of the OR circuit OR1 which controls on/off of the load modulation controlling transistor M5 becomes equal to the output of the comparator 31. That is, the load modulation controlling transistor M5 is turned on/off in synchronization with the synchronous rectifying transistor M2. When the load modulation control signal COM is switched to "L" from "H", if a current flows into the input terminal LX1, the output of the comparator 31 becomes "L", and the synchronous rectifying transistor M2 is brought into an off state. Accordingly, the output of the OR circuit OR1 also becomes "L", and the load modulation controlling transistor M5 is brought into an off state.

Since the potential of the input terminal LX1 is VLX1 (H) at this time, the charge voltage VC4 of the load regulating capacitance C4 is VLX1 (H) as expressed by equation (4).

When the current flows out of the input terminal LX1 thereafter, the potential of the input terminal LX1 changes to VLX1 (L), and therefore the load regulating capacitance C4 starts discharge.

In the conventional load modulation circuit, the load modulation controlling transistor M5 is off while the load modulation control signal COM="L". Accordingly, the load regulating capacitance C4 cannot perform discharge, and the drain potential VD (M5) of the load modulation controlling transistor M5 drops to VLX1 (L)−VLX1 (H).

Figure 3:
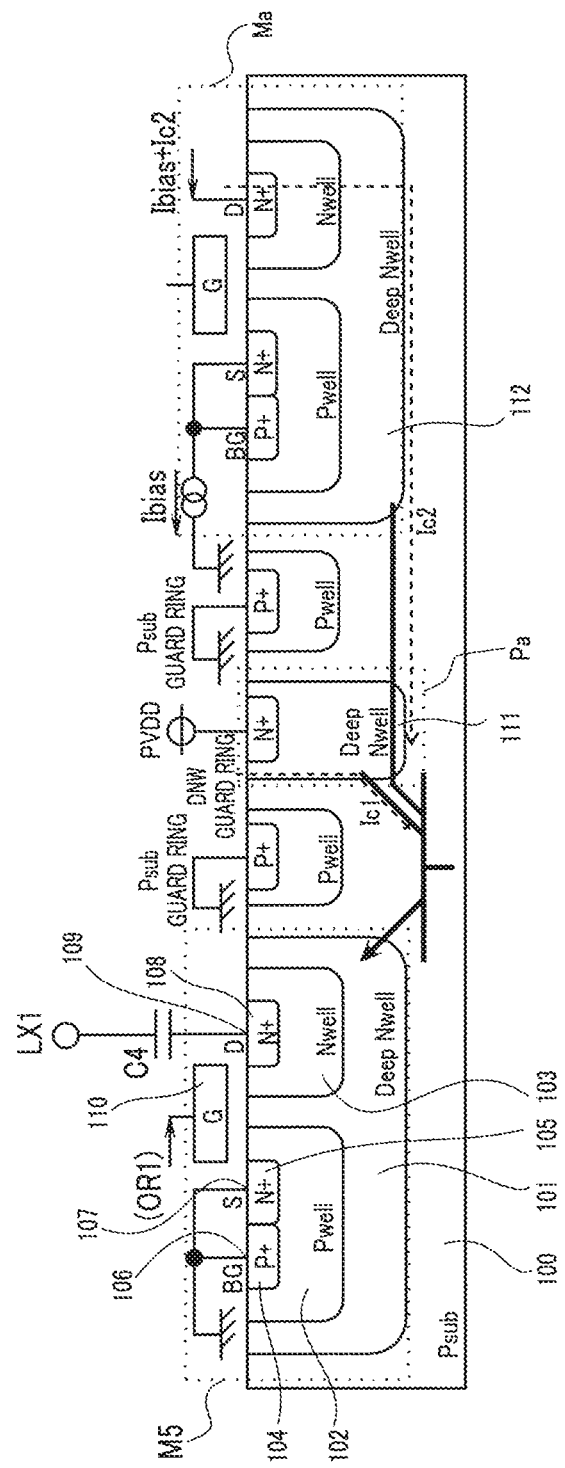
FIG. 3 is a sectional view explaining structures of a load modulation controlling transistor M5 and peripheral circuits.

Here, the load modulation controlling transistor M5 is usually incorporated into the same chip as a peripheral circuit by using a C-DMOS process, and therefore is configured by LDMOS with a high withstand voltage. FIG. 3 is a sectional view explaining structures of the load modulation controlling transistor M5 and the peripheral circuits. As shown in FIG. 3, the load modulation controlling transistor M5 is formed on an n-type well (Deep Nwell) 101 that is injected to a p-type semiconductor substrate (Psub) 100.

In an upper portion of the n-type well (Deep Nwell) 101, a p-type body diffusion region (Pwell) 102 and an n-type diffusion region (Nwell) 103 are formed at positions separated by a predetermined distance. In an upper portion of the p-type body diffusion region (Pwell) 102, a p-type back gate diffusion region (P+) 104 of high density and an n-type source diffusion region (N+) 105 of high density are formed to be in contact with each other. A back gate electrode (BG) 106 is connected to the p-type back gate diffusion region (P+) 104, and a source electrode 107 is connected to the n-type source diffusion region (N+) 105, respectively. In an upper portion of the n-type diffusion region (Nwell) 103, an n-type drain diffusion region (N+) 108 of high density is formed, and a drain electrode (D) 109 is connected to the n-type drain diffusion region (N+) 108. On a surface of the semiconductor substrate 100, a gate electrode (G) 110 is formed via a gate oxide film not illustrated so as to cover a part of the p-type body diffusion region (Pwell) 102 and the n-type well (Deep Nwell) 101, and a part of the n-type diffusion region (Nwell) 103.

The source electrode 107 and the back gate electrode 106 are connected to GND. The drain electrode 109 is connected to one end of the load regulating capacitance C4. The other end of the load regulating capacitance C4 is connected to the input terminal LX1. The gate electrode 110 is connected to the OR circuit OR1, and receives an output signal from the OR circuit OR1.

In the configuration like this, a parasitic diode is formed between an n-type diffusion region which continues from the n-type drain diffusion region (N+) 108 to the n-type diffusion region (Nwell) 103 and the n-type well (Deep Nwell) 101, and the semiconductor substrate 100, and when the load regulating capacitance C4 which is used for the purpose of load modulation is in a state accumulating electric charges, the load modulation controlling transistor M5 is in an off state, and the drain voltage drops by a forward direction voltage or more from the reference voltage (GND), the parasitic diode becomes a discharge path of the load regulating capacitance C4.

A discharge current IC4 of the load regulating capacitance C4 at this time is expressed by equation (6) shown as follows.

$$IC4 = \frac{VLX1(H) - VLX1(L) - VF}{Rp} \times e^{[-t/(C4 \times Rp)]} \quad \text{equation (6)}$$

In equation (6), VF represents a forward voltage of the parasitic diode which is formed between the semiconductor substrate 100 and the n-type drain diffusion region (N+) 108, and Rp represents a parasitic resistance between GND and the drain potential VD (M5) of the load modulation controlling transistor M5.

The discharge current IC4 at this time is restricted by only the parasitic resistance, and therefore is likely to reach a current capability limit value of the parasitic diode which is formed between the n-type diffusion region continuing from the n-type drain diffusion region (N+) 108 to the n-type diffusion region (N well) 103 and the n-type well (Deep Nwell) 101, and the semiconductor substrate 100.

When the drain potential VD (M5) of the load modulation controlling transistor M5 reaches GND−VF by discharge of the load regulating capacitance C4, the discharge path is eliminated, and the charge voltage VC4 of the load regulating capacitance C4 is fixed to a value of equation (7) shown as follows.

$$VC4 = VLX1(L) - VD(M5) \quad \text{equation (7)}$$
$$= GND - Ichg \times Ron(M2) - (GND - VF)$$
$$= VF - Ichg \times Ron(M2)$$

As shown in FIG. 3, the load modulation controlling transistor M5 is usually configured by LDMOS with a high withstand voltage by using a C-DMOS process. Accordingly, the load modulation controlling transistor M5 is not completely separated electrically from peripheral circuits such as a high potential power supply Pa and a peripheral transistor Ma, and is likely to be in a conductive state in a deep region of the semiconductor substrate 100.

As described above, when the load modulation control signal COM is switched from "H" to "L", a parasitic bipolar transistor with the n-type well (Deep Nwell) 101 as an emitter, the semiconductor substrate 100 as a base, and n-type diffusion regions (Deep Nwell) 111 and 112 of the peripheral circuits, which are in contact with the semiconductor substrate 100 and are located in a vicinity of the load modulation controlling transistor M5 as a collector is operated by a discharge current by the parasitic diode which is formed between the n-type diffusion region which continues from the n-type drain diffusion region (N+) 108 to the n-type diffusion region (Nwell) 103 and the n-type well (Deep Nwell) 101, and the semiconductor substrate 100. Accordingly, when a high potential is applied to the n-type diffusion region (Deep Nwell) 111 in the high potential power supply Pa, it is possible that power consumption by a collector current Ic1 of the parasitic bipolar transistor becomes tremendous and the heating value increases. Further, it is possible that the peripheral transistor Ma which supplies a collector current Ic2 of the parasitic bipolar transistor also erroneously operates.

In the load modulation circuit of the present embodiment, the potential of the input terminal LX1 changes to VLX1 (L) when a current flows out of the input terminal LX1, and therefore, the load regulating capacitance C4 starts discharge. At this time, the synchronous rectifying transistor M2 is turned on, and therefore, the load modulation controlling transistor M5 is also turned on in synchronization with the synchronous rectifying transistor M2. Accordingly, the discharge current IC4 of the load regulating capacitance C4 is restricted by on resistance of the load modulation controlling transistor M5, and is expressed by equation (8) shown as follows.

$$IC4 = \frac{VLX1(H) - VLX1(L)}{Ron(M5)} \times e^{[-t/(C4 \times Ron(M5))]} \quad \text{equation (8)}$$

Finally, the drain potential VD (M5) of the load modulation controlling transistor M5 converges to 0 V, and from then on, the respective states of 1) to 3) are repeated.

In this way, according to the present embodiment, the discharge current IC4 of the load regulating capacitance C4 has a current value which is restricted by the on resistance of the load modulation controlling transistor M5. That is, since the load regulating capacitance C4 starts discharge, and the load modulation controlling transistor M5 is turned on in synchronization with the synchronous rectifying transistor M2, the discharge path to GND is ensured via the load modulation controlling transistor M5. Likewise, since the load regulating capacitance C5 starts discharge, and the load modulation controlling transistor M6 is turned on in synchronization with the synchronous rectifying transistor M4, the discharge path to GND is ensured via the load modulation controlling transistor M6.

Accordingly, discharge by the parasitic diode which is formed between the n-type diffusion region which continues from the n-type drain diffusion region (N+) 108 to the n-type diffusion region (Nwell) 103 and the n-type well (Deep Nwell) 101, and the semiconductor substrate 100 can be avoided. Thereby, the parasitic bipolar transistor with the n-type well (Deep Nwell) 101 as the emitter, the semiconductor substrate 100 as the base, and the n-type diffusion regions (Deep Nwell) 111 and 112 of the peripheral circuits located in the vicinity of the load modulation controlling transistor M5 as the collector does not operate. Therefore, the peripheral circuits using the near diffusion regions to be the supply source of the collector current can be prevented from erroneously operating, and the heating value can be prevented from increasing.

Figure 4:
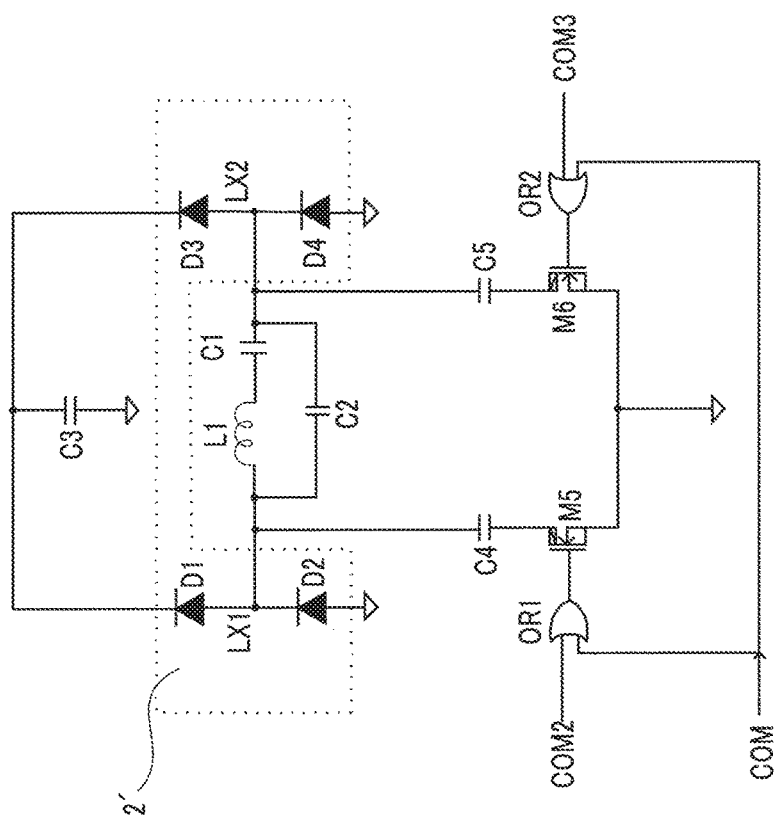
FIG. 4 is a schematic block diagram explaining another configuration of the wireless power supply antenna device using the load modulation circuit according to the present embodiment.

Note that the synchronous rectification circuit 2 may be configured by four diodes D1, D2, D3 and D4, in place of the four synchronous rectifying transistors M1, M2, M3 and M4. FIG. 4 is a schematic block diagram explaining another configuration of the wireless power supply antenna device using the load modulation circuit according to the embodiment of the present invention. As shown in FIG. 4, a synchronous rectification circuit 2' is a full-bridge synchronous rectification circuit configured by the four diodes D1, D2, D3 and D4. The synchronous rectification circuit 2 shown in FIG. 1 has a gate voltage regulation circuit configured by the four comparators 21, 22, 31 and 32, the two inverters INV1 and INV2, and the two level shift circuits 11 and 12, in order to switch on/off of the four synchronous rectifying transistors M1, M2, M3 and M4, but the diode type synchronous rectification circuit 2' shown in FIG. 4 does not need such a gate voltage regulation circuit.

An anode of the diode D1 for synchronous rectification and a cathode of the diode D2 for synchronous rectification are connected to the input terminal LX1. An anode of the diode D3 for synchronous rectification and a cathode of the diode 4 for synchronous rectification are connected to the input terminal LX2. Further, the diodes D1 and D3 for synchronous rectification have respective cathodes connected to one end of the full-wave rectification smoothing capacitance C3. The diodes D2 and D4 for synchronous rectification have respective anodes connected to GND (ground).

That is, when the potential of the input terminal LX1 is higher than the potential of the input terminal LX2, electric charges are accumulated in the full-wave rectification smoothing capacitance C3 from GND connected to an anode of the diode D4 via the diode D4, the series resonant capacitance C1, the power receiving antenna coil L1 and the diode D1. Further, when the potential of the input terminal LX2 is higher than the potential of the input terminal LX1, electric charges are accumulated in the full-wave rectification smoothing capacitance C3 from GND connected to an anode of the diode D2 via the diode D2, the power receiving antenna coil L1, the series resonant capacitance C1 and the diode D3.

The load modulation control signal COM and a control signal COM2 are inputted to the OR circuit OR1. The control signal COM2 outputs "H" when a current flows out of the input terminal LX1, and outputs "L" when a current flows into the input terminal LX1. The load modulation control signal COM and a control signal COM3 are inputted to the OR circuit OR2. The control signal COM3 outputs "H" when a current flows out of the input terminal LX2, and outputs "L" when a current flows into the input terminal LX2.

That is, in a state without load modulation and in a case where a current flows out of the input terminal LX1, the control signal COM2 which turns on the load modulation controlling transistor M5 is inputted to the OR circuit OR1 in order to ensure a discharge path of the load regulating capacitance C4. Likewise, in the state without load modulation and in a case where a current flows out of the input terminal LX2, the control signal COM3 which turns on the load modulation controlling transistor M6 is inputted to the OR circuit OR2 in order to ensure a discharge path of the load regulating capacitance C5.

Charge and discharge operations of the load regulating capacitances C4 and C5 at a time of load modulation are similar to the operation of the wireless power supply antenna device using the load modulation circuit shown in FIG. 1 if the output waveform of the comparator 31 is replaced with an output waveform of the control signal COM2, in FIG. 2.

In this way, even in the case where the diodes are used in the full-wave rectification circuit, the load modulation controlling transistor M5 is turned on, when the load regulating capacitance C4 starts discharge, and a current flows out of the input terminal LX1, and therefore, a discharge path to GND is ensured via the load modulation controlling transistor M5.

Likewise, the load modulation controlling transistor M6 is turned on, when the load regulating capacitance C5 starts discharge, and a current flows out of the input terminal LX2, and therefore, a discharge path to GND is ensured via the load modulation controlling transistor M6. Accordingly, discharge by the parasitic diode, which is formed between the n-type diffusion region which continues from the n-type drain diffusion region (N+) 108 to the n-type diffusion region (Nwell) 103 and the n-type well (Deep Nwell) 101, and the semiconductor substrate 100, can be avoided.

Thereby, the parasitic bipolar transistor with the n-type well (Deep Nwell) 101 as the emitter, the semiconductor substrate 100 as the base, and the n-type diffusion regions (Deep Nwell) 111 and 112 of the peripheral circuits located in the vicinity of the load modulation controlling transistor M5 as the collector does not operate. Therefore, the peripheral circuits which use the near diffusion regions to be the supply source of the collector current can be prevented from erroneously operating, and the heating value can be prevented from increasing.

The respective "sections" in the present description are conceptual matters corresponding to the respective functions of the embodiment, and are not always in one to one correspondence with specific hardware and software routines. Accordingly, in the present description, explanation is made under the assumption of virtual circuit blocks (sections) having the respective functions of the embodiment.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A load modulation circuit, comprising:
a capacitive load;
a switch element configured to connect a second end of the capacitive load to a point of reference potential, a first end of the capacitive load being connected to an end portion of a coil; and
a control section configured to perform
a first control to perform On/Off control of the switch element for load modulation; and
a second control to control an amount of electric charges accumulated in the capacitive load,
wherein the control section discharges, by the second control, the electric charges accumulated in the capacitive load by switching the switch element to on in accordance with a change in level at the end portion of the coil, when the switch element is switched to off by the first control,
wherein the coil is wirelessly supplied with electric power, and
wherein the control section switches, by the second control, the switch element to on in synchronization with a timing at which a low side switch of a synchronous rectification circuit is turned on, when the switch element switched to off.

2. The load modulation circuit according to claim 1, wherein
the switch element is a first MOS transistor.

3. The load modulation circuit according to claim 2, wherein the first MOS transistor is a laterally diffused MOS transistor.

4. The load modulation circuit according to claim 3, wherein the control section switches the first MOS transistor to on in synchronization with a timing at which the low side switch of a synchronous rectification circuit is turned on, after an end of load modulation.

5. The load modulation circuit according to claim 4, wherein the low side switch is a second MOS transistor, and
the control section generates a third control signal configured by a logical sum of a first control signal for the first control, and a second control signal that switches an operation of the second MOS transistor, and inputs the third control signal to the first MOS transistor.

6. The load modulation circuit according to claim 2, wherein the low side switch is a second MOS transistor, and
the control section generates a third control signal configured by a logical sum of a first control signal for the first control, and a second control signal that switches an operation of the second MOS transistor, and inputs the third control signal to the first MOS transistor.

7. The load modulation circuit according to claim 1, wherein the first end of the capacitive load is connected to each of both ends of the coil and the second end of the capacitive load is connected to the switch element.

8. A load modulation circuit comprising:
a capacitive load;
a switch element configured to connect a second end of the capacitive load to a point of reference potential, a first end of the capacitive load being connected to an end portion of a coil; and
a control section configured to perform
a first control to perform On/Off control of the switch element for load modulation; and
a second control to control an amount of electric charges accumulated in the capacitive load,
wherein the control section discharges, by the second control, the electric charges accumulated in the capacitive load by switching the switch element to on in accordance with a change in level at the end portion of the coil, when the switch element is switched to off by the first control, wherein the first end of the capacitive load is connected to each of both ends of the coil and second and the second end of the capacitive load is connected to the switch element, and wherein the control section discharges the electric charges accumulated in the capacitive load with the first end connected to each of two low side switches, in synchronization with a timing at which the two low side switches provided in a synchronous rectification circuit are turned on.

9. The load modulation circuit according to claim 8, wherein the switch element comprises a first MOS transistor.

10. The load modulation circuit according to claim 9, wherein the first MOS transistor is a laterally diffused MOS transistor.

11. A semiconductor device, comprising:
a first MOS transistor configured to connect a second end of a capacitor to a point of reference potential, a first end of the capacitor being connected to an end portion of a coil; and
an OR circuit configured to receive a first control signal that controls impedance of the coil, and a second control signal that is synchronized with an operation of a low side switch of a synchronous rectification circuit that rectifies an AC current flowing in the coil to output the rectified current, the OR circuit having an output connected to a gate electrode of the first MOS transistor,
wherein the OR circuit discharges, by the second control signal, the electric charges accumulated in the capacitive load by switching the first MOS transistor to on in accordance with a change in level at the end portion of the coil, when the first MOS transistor is switched to off by the first control signal,
wherein the coil is wirelessly supplied with electric power, and
wherein the OR circuit switches, by the second control signal, the first MOS transistor to on in synchronization with a timing at which the low side switch of the synchronous rectification circuit is turned on, when the first MOS transistor is switched to off.

12. The semiconductor device according to claim 11, wherein the first MOS transistor is a laterally diffused MOS transistor.

13. The semiconductor device according to claim 11, wherein the low side switch of the synchronous rectification circuit is a second MOS transistor.

14. The semiconductor device according to claim 13, wherein the first MOS transistor is a laterally diffused MOS transistor.

15. A wireless power supply system, comprising:
an antenna coil configured to receive electric power that is wirelessly supplied;
a synchronous rectification circuit configured to rectify an AC current flowing in the antenna coil to output the rectified current;
a capacitor;
a switch configured to connect a second end of the capacitor to a point of reference potential, a first end of the capacitor being connected to an end portion of the antenna coil when load modulation is performed by changing impedance of the antenna coil; and
a control section configured to perform
a first control to control an operation of the switch; and
a second control to control an amount of electric charges accumulated in the capacitor,
wherein the control section discharges, by the second control, the electric charges accumulated in the capacitor by switching the switch to on in accordance with a change in level at an end portion of the antenna coil, after switching the switch to off by the first control, and
wherein the antenna coil is wirelessly supplied with electric power, and
wherein the control section switches, by the second control, the switch to on in synchronization with a timing at which a low side switch of the synchronous rectification circuit is turned on, when the switch is switched to off.

16. The wireless power supply system according to claim 15, wherein the switch is a first MOS transistor.

17. The wireless power supply system according to claim 16, wherein the first MOS transistor is a laterally diffused MOS transistor.

18. The wireless power supply system according to claim 16, wherein the low side switch is a second MOS transistor, and
the control section generates a third control signal configured by a logical sum of a first control signal that switches presence or absence of the load modulation, and a second control signal that switches an operation of the second MOS transistor, and inputs the third control signal to the first MOS transistor.

* * * * *